United States Patent [19]
Mori

[11] Patent Number: 5,568,141
[45] Date of Patent: Oct. 22, 1996

[54] WAVEFORM SHAPING APPARATUS

[75] Inventor: Hidehito Mori, Anjo, Japan

[73] Assignee: Nippondenso Co., Ltd., Kariya, Japan

[21] Appl. No.: 265,013

[22] Filed: Jun. 24, 1994

[30] Foreign Application Priority Data

Jun. 25, 1993 [JP] Japan .................. 5-155645

[51] Int. Cl.⁶ .................................. H03M 1/06
[52] U.S. Cl. .................. 341/118; 341/158; 123/417
[58] Field of Search ............................ 341/118, 120, 341/158, 155

[56] References Cited

U.S. PATENT DOCUMENTS

| | | | |
|---|---|---|---|
| 4,229,703 | 10/1980 | Bustin | 328/162 |
| 4,281,317 | 7/1981 | Pace | 341/167 |
| 4,291,300 | 9/1981 | Bader | 341/157 |
| 4,573,347 | 3/1986 | Sekiguchi et al. | 73/119 A |
| 4,578,711 | 3/1986 | White et al. | 358/282 |
| 5,213,080 | 5/1993 | Lambert et al. | 123/417 |
| 5,264,844 | 11/1993 | Itou et al. | 341/11 |
| 5,451,952 | 9/1995 | Yamazaki et al. | 341/158 |

FOREIGN PATENT DOCUMENTS

| | | |
|---|---|---|
| 447216 | 2/1992 | Japan . |
| 463949 | 2/1992 | Japan . |
| 4353242 | 12/1992 | Japan . |
| 586954 | 4/1993 | Japan . |

Primary Examiner—Marc S. Hoff
Attorney, Agent, or Firm—Cushman Darby & Cushman

[57] ABSTRACT

A waveform-shaping apparatus for determining engine speed of an automotive vehicle is provided. The apparatus includes a waveform-shaping circuit including a comparator for comparing an input analog signal, alternating in synchronism with rotation of an engine, with a reference signal, so as to produce a binary-coded signal, provided with high and low levels, indicative of the engine speed. A hysteresis providing circuit provides first and second hysteresis components having first and second hysteresis levels to the input analog signal and the reference signal, respectively, to increase a difference in level between the input analog signal and the reference signal so as to mask the influence of noise from interfering with an operation of the waveform shaping circuit. A correcting circuit corrects at least either of the first and second hysteresis levels and time periods during which the first and second hysteresis components are applied, in a preselected relation to a given noise factor.

40 Claims, 5 Drawing Sheets

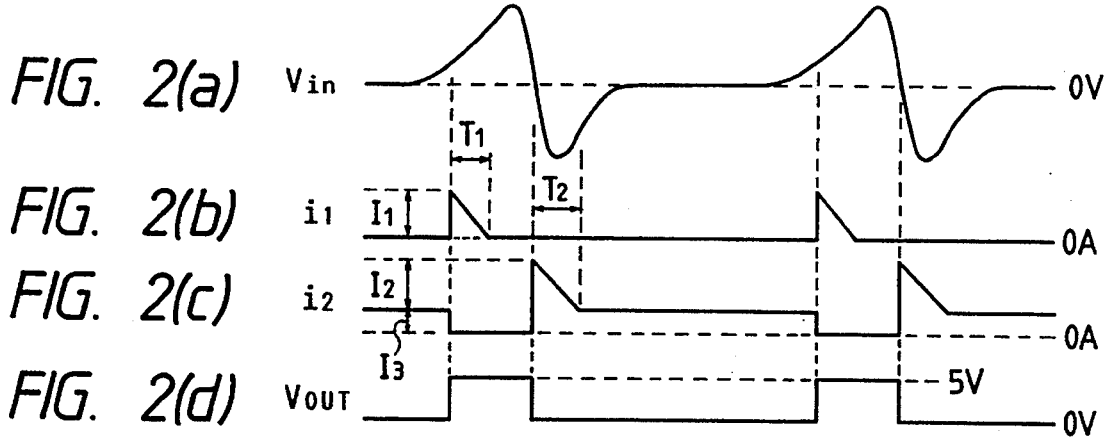
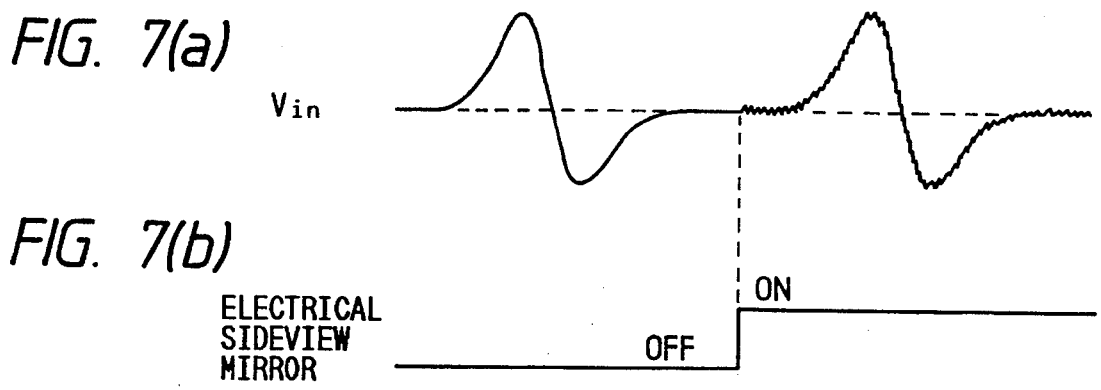

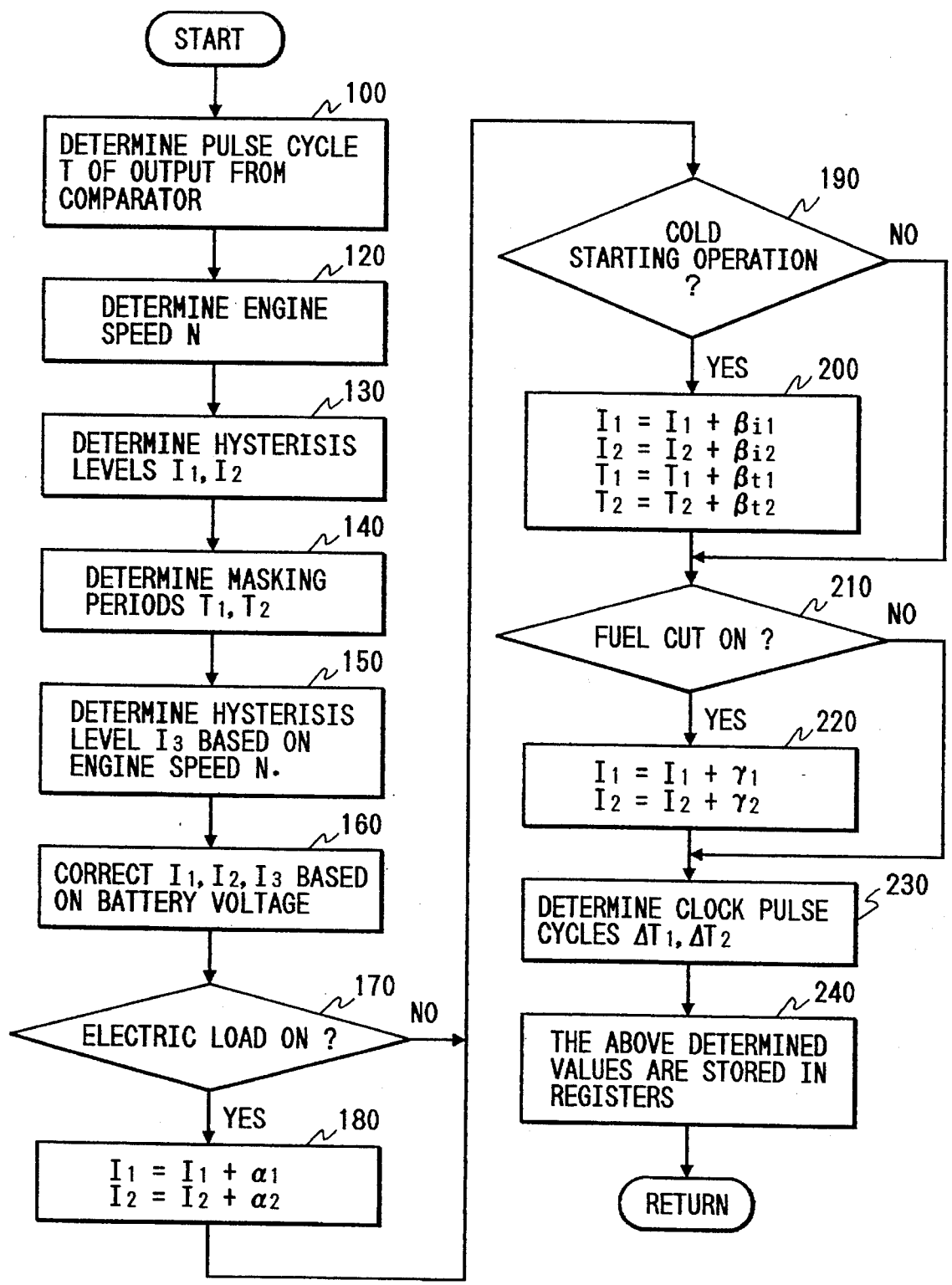

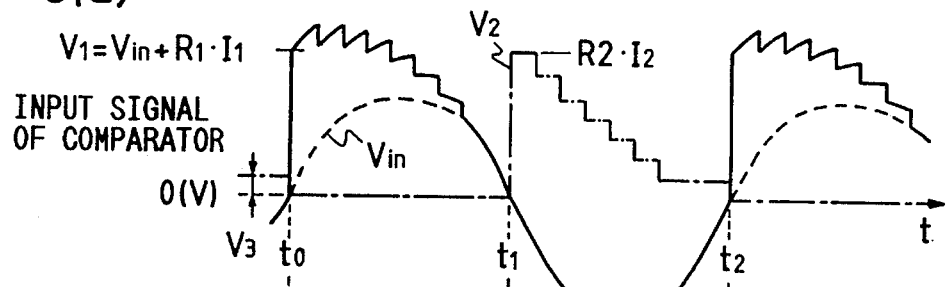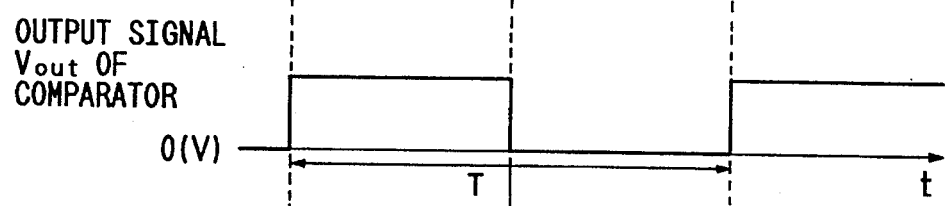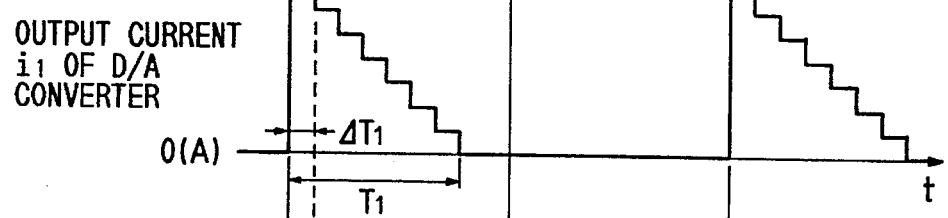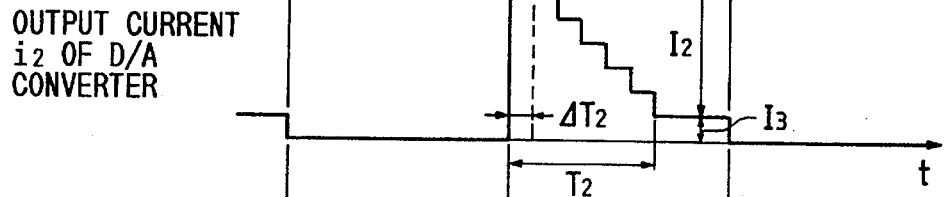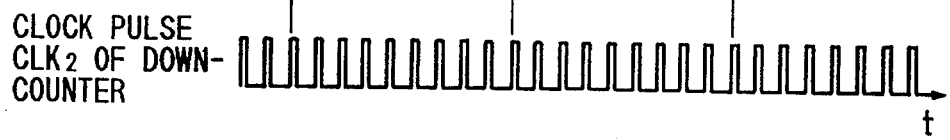

WAVEFORM SHAPING APPARATUS

BACKGROUND OF THE INVENTION

1. Technical Field of the Invention

The present invention relates generally to a waveform shaping circuit for shaping a waveform of an input analog signal into a desired form. More particularly, the invention is directed to an improved waveform shaping circuit which may be employed in an electronic control system for an automotive engine to waveform-shape an alternating analog signal, such as a crank angle signal indicative of engine speed and detected by an electromagnetic pickup, into binary-coded signals exactly corresponding to an alternating cycle of the detected analog signal.

2. Background Art

An electronic control system for an internal combustion engine of an automotive vehicle is conventionally designed to monitor engine speed so as to control ignition timing and fuel injection operations. An electromagnetic pickup is commonly used to measure the engine speed. The electromagnetic pickup detects an angular position of a crank shaft and provides an analog signal which alternates sychronously with rotation of the crank shaft. The alternating analog signal is then converted by a waveform shaping circuit into a binary-coded signal to allow the electronic control system to determine the engine speed.

In order to control engine operating conditions sensor signals indicative of such conditions as coolant temperature and battery voltage, and control signals such as an electric load signal, an idling signal, and an engine starter signal, are utilized in the electronic control system. These signals will, however, produce unwanted electrical disturbances or noise which may interfere with the activity of the waveform shaping circuit, leading to error in determining engine speed. Consequently a proposed waveform shaping circuit provides ramp current to an input alternating analog signal in synchronism with high and low level periods of a binary-coded signal to provide a hysteresis component. This promotes a difference in level between the input analog signal and a reference signal greater than the noise levels caused by the above discussed external signals thus eliminates the influence of the noise.

However, this proposed prior art waveform shaping circuit further encounters another drawback as discussed below. The magnitude and phase of noise superimposed on an output signal of the electromagnetic pickup vary according to changes in engine speed. Therefore, the prior art circuit arrangement wherein constant hysteresis is given to the input analog signal, is unable to eliminate the influence of the noise over a wide range of the engine speeds. Additionally, noise also varies according to engine operating conditions and environmental conditions such as engine coolant temperature, battery voltage, ON/OFF states of electric loads and fuel cut operation. The prior art circuit arrangement does not consider the influence caused by such various noise factors at all.

SUMMARY OF THE INVENTION

It is therefore a principal object of the present invention to avoid the disadvantages of the prior art.

It is another object of the present invention to provide an improved structure of a waveform shaping circuit which is designed to completely eliminate the influence of noise from interfering with a waveform-shaping operation.

According to one aspect of the present invention, there is provided a waveform-shaping apparatus which includes a waveform-shaping means for waveform-shaping an input analog signal into a binary-coded signal, the so as to provide a high level signal when the input analog signal is greater than a reference signal and a low level signal when the input analog signal is smaller than the reference signal. A hysteresis providing means provides first and second hysteresis components having first and second hysteresis levels, respectively to increase a difference in level between the input analog signal and the reference signal in order to mask the influence of noise from interfering with an operation of the waveform shaping means. The first hysteresis component is applied to the input analog signal during a time when the high level signal is produced, and the second hysteresis component is applied to the reference signal during a time when the low level signal is produced. Furthermore, and a correcting means corrects the first and second hysteresis components in a preselected relation to a given noise factor which interferes with the operation of the waveform shaping means in order eliminate the influence of noise of the given factor on the operation of the waveform shaping means.

According to another aspect of the invention, there is provided a waveform-shaping apparatus for determining engine speed of an automotive vehicle which includes a waveform-shaping circuit including a comparator for comparing an input analog signal, alternating in synchronism with rotation of an engine, with a reference signal so as to produce a binary-coded signal indicative of the engine and which is provided with high and low levels. The high level is provided when the input analog signal is greater than the reference signal, and the low level is provided when the input analog signal is smaller than the reference signal. A hysteresis providing circuit provides first and second hysteresis components having first and second hysteresis levels, respectively, to increase a difference in level between the input analog signal and the reference signal so as to mask the influence of noise from interfering with an operation of the waveform shaping circuit. The first hysteresis component is determined based on the engine speed and is applied to the input analog signal during a time when the high level is produced. The second hysteresis component is determined based on the engine speed and is applied to the reference signal during a time when the low level is produced. Finally, a correcting circuit corrects the first and second hysteresis components in a preselected relation to a given noise factor which interferes with the operation of the waveform shaping circuit.

In the preferred mode, the hysteresis providing circuit applies the first hysteresis component to the input analog signal for a first length of time and the second hysteresis component to the reference signal for a second length of time. The first and second lengths of time are decreased according to an increase in the engine speed.

The correcting circuit modifies the first and second hysteresis levels of the first and second hysteresis components based on the given factor of the noise. Additionally, the correcting circuit may modify the first length of time the first hysteresis component is applied to the input analog signal and the second length of time the second hysteresis component is applied to the reference signal according to the type of noise factor.

The correcting circuit increases the first and second hysteresis levels of the first and second hysteresis components according to an increase in voltage of a battery incorporated in the vehicle.

The correcting circuit also modifies the first and second hysteresis levels of the first and second hysteresis components according to an ON/OFF state of a preselected electric load incorporated in the vehicle.

The correcting circuit further modifies the first and second hysteresis levels of the first and second hysteresis components and the first and second lengths of time when the engine is in a cold starting operation.

The correcting circuit still further modifies the first and second hysteresis levels of the first and second hysteresis components when the engine is undergoing a fuel cut.

The apparatus further comprises first and second down-counters and first and second clocks. The first down-counter is responsive to clock pulses produced from the first clock so as to decrease the first hysteresis level to a given lower level at a first rate within the first length of time, as defined by a cycle of the clock pulses from the first clock. The second down-counter is responsive to clock pulses produced from the second clock to decrease the second hysteresis level to a given lower level at a second rate within the second length of time, as defined by a cycle of the clock pulses from the second clock.

The given lower level to which the second hysteresis level is decreased is preset to zero in response to rising of the binary-coded signal.

The second hysteresis level of the second hysteresis component is provided with the sum of a variable level and a constant level. The variable level is decreased from a maximum level to a minimum level equal to the constant level within the second length of time, while the maximum level and the minimum level is determined according to the engine speed.

BRIEF DESCRIPTION OF THE DRAWINGS

The present invention will be understood more fully from the detailed description given hereinbelow and from the accompanying drawings of the preferred embodiment of the invention, which, however, should not be taken to limit the invention to the specific embodiment but are for the purpose of explanation and understanding only.

In the drawings:

FIGS. 2(a), 2(b), 2(c), and 2(d) are time-charts which show the relation among input and output signals of a comparator and hysteresis components applied to the comparator;

FIG. 3 is a flowchart which shows a sequence of logical steps performed by a waveform shaping apparatus of the invention for eliminating the influence of various noise factors on a waveform-shaping operation;

FIGS. 7(a) and 7(b) are time-charts which shows the relation between an operation of an electric load and noise caused thereby superimposed on an input analog signal to a waveform shaping circuit; and FIGS. 8(a), 8(b), 8(c), 8(d), 8(e), and 8(f) are time-charts which show operations of a waveform shaping apparatus of the invention.

DESCRIPTION OF THE PREFERRED EMBODIMENT

Figure 1:
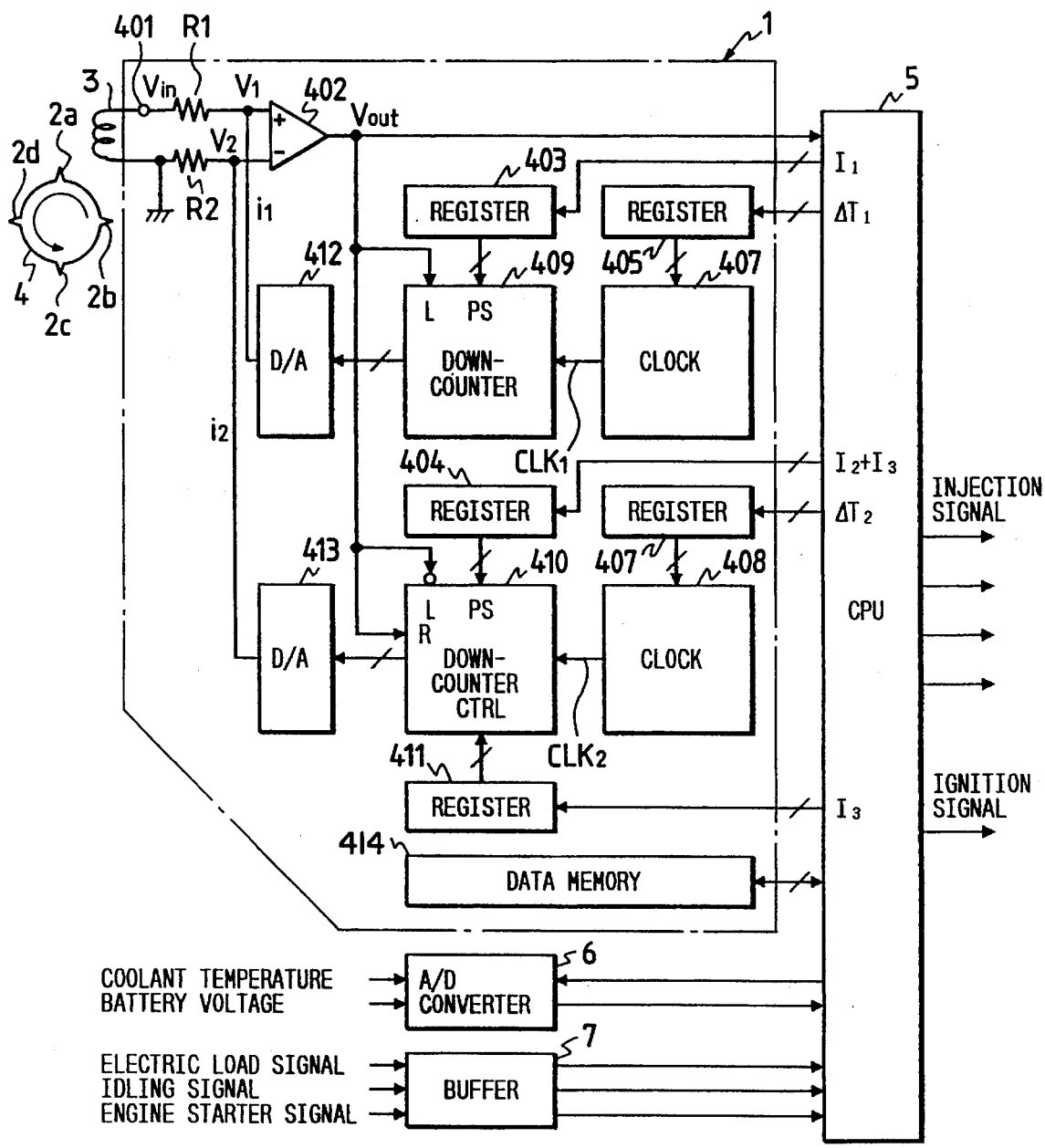
FIG. 1 is a circuit diagram which shows a waveform shaping apparatus according to the present invention.

Referring now to the drawings, wherein like numbers refer to like parts in several views, particularly to FIG. 1, there is shown a waveform shaping apparatus according to the present invention. The apparatus may be incorporated in an electronic control system for an automotive engine (not shown) for waveform-shaping an analog signal, alternating in synchronization with rotation of the engine and provided through an electromagnetic pickup 3, into a binary-coded signal corresponding to a cycle of the alternating analog signal.

The electronic control system includes a CPU 5 which determines engine speed based on a cycle of the signal waveform-shaped by a waveform shaping circuit 1 and processes detected signals indicative of engine coolant temperature and battery voltage inputted from an A/D converter 6 and an electric load signal, an idling signal, and an engine starter signal inputted from a buffer 7 for providing fuel injection and ignition signals. The CPU 5 also serves to calculate hysteresis waveform constants, as will be discussed hereinafter in detail, and correct the same in this embodiment.

A signal rotor 4 is mechanically connected to a camshaft of a four-cylinder engine, for example. The electromagnetic pickup 3 includes a coil wound around a core made of a magnetic material, and detects passage of respective protrusions 2a, 2b, 2c, and 2d formed on a peripheral surface of the signal rotor 4 according to rotation thereof in synchronism with that of the camshaft so as to provide an alternating analog signal Vin to a terminal 401 of the waveform shaping circuit 1. The analog signal Vin is then inputted to a positive (+) input terminal of a comparator 402 through a resistance R1. The comparator 402 is connected to ground through a negative (−) input terminal and is applied with a comparison reference voltage.

A register 403 sets therein the height of a hysteresis waveform, or hysteresis level, determined through the CPU 5, to be provided in a logic high-level period of a waveform-shaped binary-coded signal Vout output from the comparator 402. A register 404 sets therein a hysteresis level, determined by the CPU 5, to be provided in a logic low-level period of the waveform-shaped binary-coded signal Vout.

Additionally, a register 405 sets therein the time length (which corresponds to a counting cycle of a down-counter 409 as will be described hereinafter in detail) of the hysteresis waveform in the logic high-level period of the waveform-shaped binary-coded signal Vout determined by the CPU 5. Similarly, a register 406 sets therein the time length (which corresponds to a counting cycle of a down-counter 410 as will be referred to hereinafter in detail) of the hysteresis waveform in the logic low-level period of the waveform-shaped binary-coded signal Vout determined by the CPU 5.

A clock 407 generates clock pulses CLK1 having a cycle corresponding to the set value of the register 405. A clock 408 produces clock pulses CLK2 having a cycle corresponding to the set value of the register 406. The clocks 407 and 408 may be provided with a known digital circuit operable to perform an exclusive-NOR operation based on outputs of a timer circuit performing a high-speed counting operation according to timing pulses used in the electronic control system and the set value of the register 405 or 406.

The down-counter 409 is responsive to the rising of the waveform-shaped binary-coded signal Vout to a logic high level to preset the set value of the register 403 and down-counts the preset value based on the clock pulses CLK1 outputted form the clock 407.

Similarly, the down-counter 410 is responsive to the falling of the waveform-shaped binary-coded signal Vout to a logic low level to preset the set value of the register 404 and down-counts the preset value based on the clock pulses CLK2 generated from the clock 408. In addition, the down-counter 410 is so designed as to modify a minimum count value based on a signal value applied to a control terminal CTRL from the CPU 4 through a register 411 and to reset the modified minimum count value to a logic "0" in response to the rising of the waveform-shaped binary-coded signal Vout appearing on a reset terminal R to the logic high level. The minimum count value is used for forming direct current (DC) hysteresis, as will be referred to hereinafter in detail.

A D/A converter 412 converts a count value of the down-counter 409 into an analog signal based on a reference voltage (not shown). The D/A converted signal is superimposed, as a hysteresis voltage $(R1 \cdot i_1)$, on the input signal Vin applied to the positive input terminal of the comparator 402 to provide an input voltage signal $V_1$.

Similarly, a D/A converter 413 converts a count value of the down-counter 410, in sequence, into an analog signal based on a reference voltage (not shown). The D/A converted signal is added, as a hysteresis voltage $(R2 \cdot i_2)$ representative of a comparison reference signal $V_2$, to the negative input terminal of the comparator 402.

A correction data memory 414 stores various data to be looked up by the CPU 5 when functioning as a correction means, as will be discussed later in detail. The data looked up during a correcting operation of the CPU 5 are factors, required for determining operating conditions of the engine, derived empirically based on such conditions as engine coolant temperature, battery voltage, an ON/OFF state of an electric load and a fuel cut, and an engine starter signal which will cause noise interfering with the electronic control system.

Referring to FIGS. 2(a) to 2(d), there are shown time-charts which represent operational timing of the waveform shaping circuit 1.

When the alternating analog signal Vin, as shown in FIG. 2(a), is inputted to the waveform shaping circuit 1 through the input terminal 401, hysteresis given by a current waveform $i_1$, as shown in FIG. 2(b), is applied to the alternating analog signal Vin through the down-counter 409 and the D/A converter 412. Additionally, to the comparison reference signal $V_2$ of the comparator 402, hysteresis provided by a current waveform $i_2$, as shown in FIG. 2(c), is added through the down-counter 410 and the D/A converter 413. The comparator 413 then produces the waveform-shaped binary-coded signal Vout, as shown in FIG. 2(d).

In FIG. 2(b), $I_1$ in the current waveform $i_1$ denotes the height of an alternating-current hysteresis waveform, or ac hysteresis level applied to the input analog signal Vin. A time $T_1$ indicates a noise-removing period (hereinafter, referred to as a masking period) by virtue of the ac hysteresis waveform. Similarly, in FIG. 2(c), $I_2$ in the current waveform $i_2$ represents an ac hysteresis level of an ac hysteresis waveform applied to the input analog signal Vin. A time $T_2$ indicates a masking period by virtue of the ac hysteresis waveform. In addition, $I_3$ in the current waveform $i_2$ indicates a direct-current hysteresis component. In the waveform shaping circuit 1 of this embodiment, $I_1, I_2, I_3, T_1$, and $T_2$, each serving as waveform-shaping constants for defining the hysteresis waveforms, are determined through the CPU 5 variably based on operating conditions of the engine as well as engine speed. Thus, even when any noise is superimposed on the input analog signal Vin, it will be prevented from interfering with the waveform-shaping operation.

There is shown in FIG. 3 a flowchart of a program or sequence of logical steps performed by the CPU 5 for determining the waveform-shaping constants $I_1, I_2, I_3, T_1$, and $T_2$ and correcting same. The CPU 5 reads the waveform-shaped binary-coded signal Vout every 10 msec, for example, to carry out the program as shown.

After entering the program, the routine proceeds to step 100 wherein a pulse cycle T of the waveform-coded signal Vout is determined. In step 120, based on the pulse cycle T, engine speed N is calculated.

The routine then proceeds to step 130 wherein the ac hysteresis level $I_1$ to be applied to the input analog signal Vin (i.e., an input voltage waveform) and the ac hysteresis level $I_2$ to be applied to the comparison reference signal are determined as a function of the engine speed N according to the following relations.

$$I_1 = f_1(N)$$

$$I_2 = f_2(N)$$

It is generally found that noise which will interfere with the input voltage waveform Vin increases in proportion to the engine speed N. Therefore, noise reduction is accomplished by determining the ac hysteresis levels $I_1$ and $I_2$ as a function of the engine speed N. The ac hysteresis levels $I_1$ and $I_2$ may be derived by looking up, according to the engine speed N, mapped data (which are set to values corresponding to count values of the down-counters 409 and 410), stored in a ROM, predetermined empirically.

Figure 4:
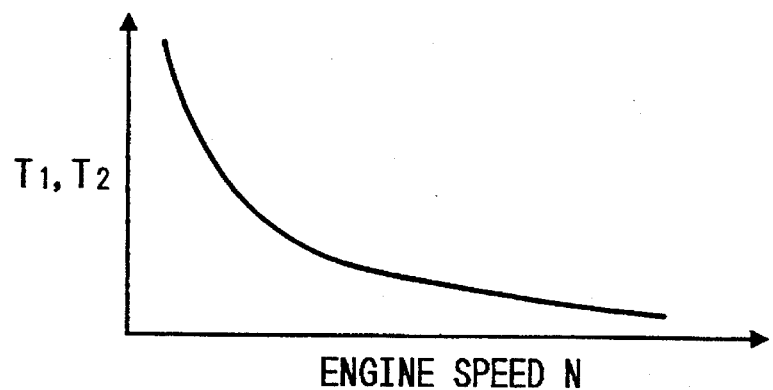
FIG. 4 is a graph which shows the relation of time periods $T_1$ and $T_2$ during which ac hysteresis levels are applied with engine speed N.

After determining the ac hysteresis levels $I_1$ and $I_2$, the routine proceeds to step 140 wherein the masking periods T1 and $T_2$ during which the hysteresis (i.e., the current waveforms $i_1$ and $i_2$) are added to the input voltage signal Vin and the comparison reference signal $V_2$, are determined so that they may be, as shown in FIG. 4, in inverse proportion to the engine speed N. This permits the masking periods $T_1$ and $T_2$ to expire completely prior to reversal of a signal level of the waveform-shaped binary-coded signal Vout.

Figure 5:
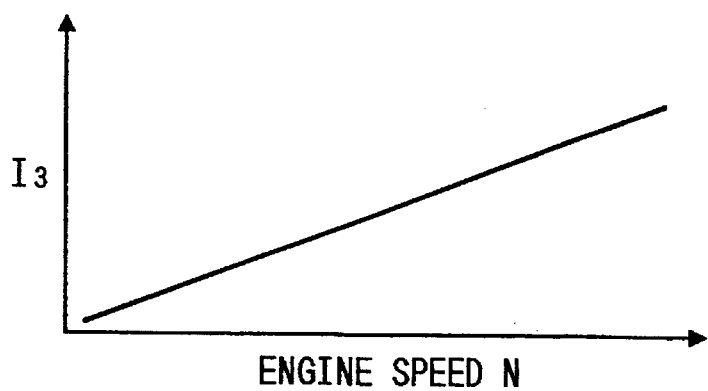
FIG. 5 is a graph which shows the relation between a dc hysteresis level $I_3$ and engine speed N.
Figure 6:
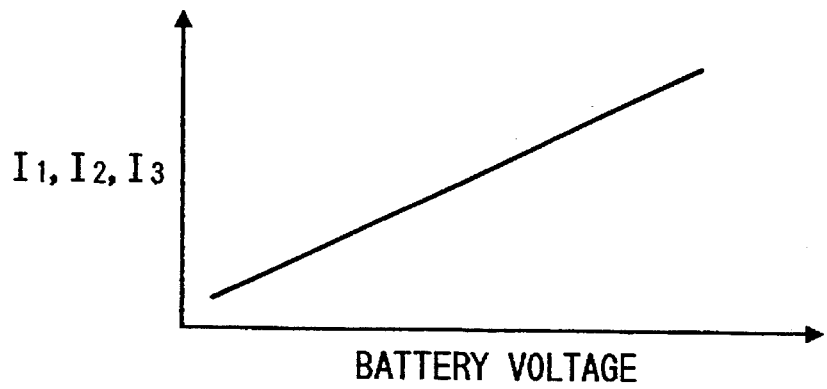
FIG. 6 is a graph which shows the relation of ac hysteresis levels $I_1$ and $I_2$ and a dc hysteresis level $I_3$ with battery voltage.

The routine then proceeds to step 150 wherein the hysteresis level $I_3$ to be applied to the comparison reference signal is determined based on the engine speed N. Since the input voltage signal Vin generally tends to decreased according to decreases in the engine speed N and to increase according to increases in the engine speed N which will lead to increased noise interfering with the signal Vin, the dc hysteresis level $I_3$, similar to the hysteresis levels $I_1$ and $I_2$, is so determined as to be proportional to the engine speed N. FIG. 5 shows the relation between the thus determined dc hysteresis level $I_3$ and the engine speed N.

After determining the ac hysteresis levels $I_1$ and $I_2$, the masking periods $T_1$ and $T_2$, and the dc hysteresis level $I_3$, the CPU 5, as discussed below, starts to correct them according to engine operating conditions.

In step 160, based on a battery voltage input through the A/D converter 6, the hysteresis levels $I_1, I_2$, and $I_3$ are corrected. Usually, electrical disturbance, or noise increases as a battery voltage level becomes high. Thus, in this embodiment, the hysteresis levels $I_1, I_2$, and $I_3$ are corrected to increase in proportion to the battery voltage. This absorbs or cancels the variation in noise caused by changes in the battery voltage.

Afterwards, the routine proceeds to step 170 wherein it is determined whether some electric load is activated or not based on the electric load signal inputted through the buffer 7. If a NO answer is obtained, meaning that the electric load is not activated, then the routine proceeds directly to step 190. Alternatively, if a YES answer is obtained, the routine then proceeds to step 180 wherein the ac hysteresis levels $I_1$, $I_2$ are further corrected according to the following equations.

$$I_1 = I_1 + \alpha_1$$

$$I_2 = I_2 + \alpha_2$$

where $\alpha_1$ and $\alpha_2$ are determined based on experimental values, and which can eliminate the influence of noise caused by the activity of the electric load, and stored in a correction data memory 414.

For example, when an electric load such as an electric sideview mirror, as shown in FIG. 7(b), is turned on, it will produce electric noise superimposed on the input voltage signal Vin, as shown in FIG. 7(a). Accordingly, the correction of the hysteresis levels $I_1$, $I_2$ to be applied to the input voltage signal Vin according to the activation of the electric load reduces the noise caused by the operation of the electric load.

After step 180, or if a NO answer is obtained in step 170, the routine then proceeds to step 190 wherein it is determined whether the engine is now in a cold starting operation or not based on an engine coolant temperature provided through the A/D converter 6 and an on/off state of the engine starter signal inputted through the buffer 7. Generally, during a cold engine starting operation wherein the engine coolant temperature is lower than a given temperature and the engine starting signal is turned on, the engine friction is great, resulting in increased mechanical vibrations. Therefore, if a YES answer is obtained concluding that the engine is in the cold starting operation, then the routine proceeds to step 200 wherein the ac hysteresis levels $I_1$, $I_2$ and the masking periods $T_1$ and $T_2$ are further corrected according to the following equations.

$$I_1 = I_1 + \beta i_1$$

$$I_2 = I_2 + \beta i_2$$

$$T_1 = T_1 + \beta t_1$$

$$T_2 = T_2 + \beta t_2$$

where $\beta i_1$, $\beta i_2$, $\beta t_1$, and $\beta t_2$ are determined based on experimental values, and which can eliminate the influence of noise caused by the cold starting operation of the engine, and stored in the correction data memory 414.

If a NO answer is obtained in step 190, meaning that the engine is not in the cold starting operation, then the routine proceeds directly to step 210.

In step 210, it is determined whether the engine is now undergoing a fuel cut or not based on the engine speed N and an on/off state of the idling signal inputted through the buffer 7. Usually, when the idling signal is turned on and the engine speed N is higher than a predetermined speed, the supply of fuel to the engine is stopped under the conclusion that the engine is being decelerated. When the fuel is cut, a higher voltage is required for ignition, causing ignition noise to increase. Therefore, if a YES answer is obtained, meaning that the engine is now undergoing the fuel cut, then the routine proceeds to step 220 wherein the ac hysteresis levels $I_1$, $I_2$ are further corrected according to the following equations.

$$I_1 = I_1 + \gamma_1$$

$$I_2 = I_2 + \gamma_2$$

where $\gamma_1$ and $\gamma_2$ are determined based on experimental values, and which are enough to eliminate the influence of noise caused by the fuel cut operation, and stored in the correction data memory 414.

If a NO answer is obtained in step 210, then the routine proceeds directly to step 230.

In step 230, cycles of the clock pulses CLK1 and CLK2 (i.e., a counting clock cycle) are determined so that counting of the down-counters 409 and 410 may terminate within the masking periods $T_1$ and $T_2$ finally determined.

For example, if a desired cycle of the dock pulse CLK1 is defined as $\Delta T_1$, it may be given by the following relation.

$$\Delta T_1 = T_1 / \text{(a value of the ac hysteresis } I_1\text{)}$$

Similarly, if a desired cycle of the clock pulse CLK2 is defined as $\Delta T_2$, it may be given by the following relation.

$$\Delta T_2 = T_2 / \text{(a value of the ac hysteresis } I_2\text{)}$$

Finally, the routine proceeds to step 240 wherein the cycles $\Delta T_1$ and $\Delta T_2$ of the clock pulses CLK1 and CLK2 are set to the register 406, the ac hysteresis level $I_1$ is stored in the register 403, the sum of the ac hysteresis level $I_2$ and the dc hysteresis level $I_3$ is stored in the register 404, and the dc hysteresis level $I_3$ is set to the register 411.

With the above processing, in the registers 403, 404, 405, 406, and 411, the ac hysteresis levels, the dc hysteresis level, the counting clock cycles of the down-counters 409 and 410 which are corrected for elimination of various noises interfering with the waveform shaping circuit 1, are stored.

FIGS. 8(a) to 8(f) show operations of the comparator 402, the D/A converters 412 and 413, and the down-counters 409 and 410.

In the following discussion, for the sake of simplicity, it is assumed that the electromagnetic pickup 3 produces an alternating analog signal having a sine wave and the voltage signal Vin inputted to the terminal 401 shows a waveform, as represented in FIG. 8(a).

When the voltage signal Vin is increased over 0(V) at a time $t_0$, the comparator 402 generates the waveform-shaped binary-coded signal Vout, as shown in FIG. 8(b).

When the signal Vout rises, it will cause 1) the ac hysteresis level $I_1$ set in the register 403 to be loaded into the down-counter 409 as a preset value, 2) the clock 407 to provide the clock pulses CLK1 having the counting clock cycle $\Delta T_1$ stored in the register 405 to the down-counter 409, and 3) the clock 408 to provide the clock pulses CLK2 having the counting clock cycle $\Delta T_2$ stored in the register 406 to the down-counter 410. The down-counter 410 is, however, reset to produce a count value "0".

The down-counter 409 then starts to count down from a count preset value corresponding to the ac hysteresis level $I_1$ in response to the clock pulses CLK1, as shown in FIG. 8(d), produced at the cycle of $\Delta T_1$. The D/A converter 412 converts the count value of the down-counter 409 into an analog signal having the current waveform $i_1$ defined by the hysteresis, as shown in FIG. 8(c).

Therefore, the input voltage signal $V_1$ applied to the positive terminal of the comparator 402, as shown in FIG. 8(a), initially rises up to a value $(Vin + R_1 \cdot I_1)$ and then decreases according to a decrease in the increased mount $(V_1 - Vin)$ by the counting operation of the down-counter 409. The increased amount $(V_1 - Vin)$ reaches zero at the time the masking period $T_1$ has expired from the time to so that the input voltage signal $V_1$ to the comparator 402 coincides with the input signal Vin appearing on the terminal 401.

Afterwards, when the waveform-shaped binary-coded signal Vout output from the comparator 402 falls to zero, as shown in FIG. 8(b), at a time $t_1$ according to the decrease in the input voltage signal $V_1$, it will cause 1) the sum $(I_2+I_3)$ of the ac hysteresis level $I_2$ and the dc hysteresis level I3 stored in the register 404 to be loaded into the down-counter 410 as a preset value, 2) the clock 408 to provide the clock pulses CLK2 having the counting clock cycle $\Delta T_2$ stored in the register 406 to the down-counter 410, and 3) the clock 407 to provide the clock pulses CLK1 having the counting clock cycle $\Delta T_1$ stored in the register 405 to the down-counter 409. The down-counter 409 however, has already reached to zero.

The down-counter 410 then starts to count down from a count preset value corresponding to the sum $(I_2+I_3)$ of the ac hysteresis level $I_2$ and the dc hysteresis level $I_3$ in response to the clock pulses CLK2, as shown in FIG. 8(f), produced at the cycle of $\Delta T_2$. The D/A converter 413 converts the count value of the down-counter 410 into an analog signal having the current waveform $i_2$ defined by the hysteresis, as shown in FIG. 8(e).

Therefore, the comparison reference signal $V_2$ applied to the negative terminal of the comparator 402, as shown in FIG. 8(a), initially rises up to a value $(R_2 \cdot I_2)$ and then decreases according the counting operation of the down-counter 410. The comparison reference signal $V_2$ reaches a voltage level corresponding to the minimum count value of the down-counter 410, or a dc hysteresis voltage at the time the masking period $T_2$ has expired from the time $t_1$. The dc hysteresis voltage is reset to 0(V) at a later time $t_2$ in response to a leading edge of the waveform-shaped binary-coded signal Vout from the comparator 402.

As apparent from the above discussion, the waveform shaping circuit 1 of the invention is designed to provide hysteresis components which increase a difference in level between the input voltage signal $V_1$ and the comparison reference signal $V_2$ input to the comparator 402 during a time the input signal Vin is greater than the comparison reference signal to produce the waveform-shaped binary-coded signal Vout having a high level and during a time the input signal Vin is smaller than the comparison reference signal so as to produce the waveform-shaped binary-coded signal Vout having a low level. In addition, the hysteresis components are corrected according to a type of noise factor which would interfere with the waveform shaping circuit and a noise level. This eliminates the influence of the noise completely.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended clams.

For example, while in the above embodiment, the CPU 5 performs the correcting operation according to engine operating conditions which have been monitored based on the battery voltage, the ON/OFF state of the electric load, and whether the engine is in the cold starting operation or not and is undergoing the fuel cut or not, the contents of the correcting operation and order thereof may be determined optionally.

In addition, the hardware, as shown in FIG. 1, is only one instance. A separate hysteresis waveform-generating circuit including clocks, down-counters, and D/A converters, may be so arranged as to be switched in response to output of a binary-coded signal from the comparator.

Further, in the above embodiment, the down-counters are used to provide ramp-shaped hysteresis components. The hysteresis components, however, may be of a sawtooth waveform, a triangular waveform, or a square waveform as long as they can be defined variably based on preselected hysteresis waveform factors related to noise interfering with the waveform shaping circuit.

What is claimed is:

1. A waveform-shaping apparatus for a speed sensor which detects a speed of a rotatable member of a vehicle, said waveform-shaping apparatus comprising:

waveform-shaping means for waveform-shaping an input analog signal from the speed sensor into a binary-coded signal, said binary-coded signal having a high level when the input analog signal is greater than a reference signal and a low level when the input analog signal is smaller than the reference signal;

hysteresis providing means for providing first and second hysteresis components having first and second hysteresis levels, respectively, said hysteresis providing means increasing a difference in level between the input analog signal and the reference signal so as to mask the influence of noise from interfering with an operation of said waveform shaping means, the first hysteresis component being applied to the input analog signal when the binary-coded signal has the high level, the second hysteresis component being applied to the reference signal when the binary-coded signal has the low level signal; and correcting means for correcting the first and second hysteresis components in a preselected relation to a given noise factor which interferes with the operation of said waveform shaping means so as to eliminate the influence of the given noise factor on the operation of said waveform shaping means.

2. A waveform-shaping apparatus as set forth in claim 1, wherein said correcting means modifies the first and second hysteresis levels of the first and second hysteresis components based on the given factor of the noise.

3. A waveform-shaping apparatus as set forth in claim 1, wherein said correcting means modifying a first length of time the first hysteresis component is applied to the input analog signal and a second length of time the second hysteresis component is applied to the reference signal based on the given factor of the noise.

4. A waveform-shaping apparatus as set forth in claim 1, wherein the first hysteresis level of the first hysteresis component is decreased at a first rate within a first time period, the second hysteresis level of the second hysteresis component being decreased at a second rate within a second time period.

5. A waveform-shaping apparatus as set forth in claim 4, further comprising first and second down-counters and first and second clocks, the first down-counter being responsive to clock pulses produced from the first clock to decrease the first hysteresis level to a given lower level at the first rate within the first time period defined by a cycle of the clock pulses from the first clock, the second down-counter being responsive to clock pulses produced from the second clock to decrease the second hysteresis level to a given lower level at the second rate within the second time period defined by a cycle of the clock pulses from the second clock.

6. A waveform-shaping apparatus as set forth in claim 1, wherein the first and second hysteresis levels of the first and second hysteresis components are determined in a preselected relation to a cycle of the input analog signal.

7. A waveform-shaping apparatus as set forth in claim 5, wherein the given lower level to which the second hysteresis level is decreased is preset to zero in response to rising of the binary-coded signal.

8. A waveform-shaping apparatus as set forth in claim 1, wherein the speed sensor is a vehicle speed sensor.

9. A waveform-shaping apparatus as set forth in claim 1, wherein the speed sensor is an engine speed sensor.

10. A waveform-shaping apparatus as set forth in claim 1, wherein said hysteresis providing means applies the first hysteresis component to the input analog signal for a first length of time and the second hysteresis component to the reference signal for a second length of time, and wherein said correcting means changes either or both of the first and second levels and the first and second lengths of time of the first and second hysteresis components according to a given vehicle condition.

11. A waveform-shaping apparatus as set forth in claim 10, wherein the input analog signal from the speed sensor indicates an engine speed, and wherein the given vehicle condition is based on whether an engine of the vehicle is in a cold starting operation or not.

12. A waveform-shaping apparatus as set forth in claim 11, wherein a determination of whether the engine is in the cold starting operation or not is made based on an engine coolant temperature and an engine starter signal.

13. A waveform-shaping apparatus as set forth in claim 10, wherein the input analog signal from the speed sensor indicates an engine speed, and wherein the given vehicle condition is based on whether an engine of the vehicle is undergoing a fuel cut or not.

14. A waveform-shaping apparatus for a rotational speed sensor which measures a rotational speed of a rotatable member of an automotive vehicle, said waveform-shaping apparatus comprising:

a waveform-shaping circuit including a comparator which compares an input analog signal with a reference signal, the input analog signal alternating in synchronism with rotation of the rotatable member, the comparator producing a binary-coded signal which is indicative of the rotational speed and which has high and low levels, the high level being provided when the input analog signal is greater than the reference signal, the low level being provided when the input analog signal is smaller than the reference signal;

a hysteresis providing circuit which provides first and second hysteresis components having first and second hysteresis levels, respectively, the hysteresis providing circuit increasing a difference in level between the input analog signal and the reference signal so as to mask the influence of noise from interfering with an operation of said waveform shaping circuit, the first hysteresis component being determined based on the rotational speed and applied to the input analog signal when the binary-coded signal has the high level, the second hysteresis component being determined based on the rotational speed and applied to the reference signal when the binary-coded signal has the low level; and a correcting circuit which corrects the first and second hysteresis components in a preselected relation to a given noise factor which interferes with the operation of said waveform shaping circuit.

15. A waveform-shaping apparatus as set forth in claim 14, wherein said hysteresis providing circuit applies the first hysteresis component to the input analog signal for a first length of time and the second hysteresis component to the reference signal for a second length of time, the first and second lengths of time being decreased according to an increase in the rotational speed.

16. A waveform-shaping apparatus as set forth in claim 15, wherein said correcting circuit modifies the first length of time the first hysteresis component is applied to the input analog signal and the second length of time the second hysteresis component is applied to the reference signal based on the given factor of the noise.

17. A waveform-shaping apparatus as set forth in claim 15, wherein the rotational speed sensor detects a speed of an engine, and wherein said correcting circuit modifies the first and second hysteresis levels of the first and second hysteresis components and the first and second lengths of time when the engine is in a cold starting operation.

18. A waveform-shaping apparatus as set forth in claim 17, wherein determination of whether the engine is in the cold stating operation or not is based on an engine coolant temperature and an engine starter signal.

19. A waveform-shaping apparatus as set forth in claim 15, wherein the first hysteresis level of the first hysteresis component is decreased at a first rate within the first length of time, the second hysteresis level of the second hysteresis component being decreased at a second rate within the second length of time.

20. A waveform-shaping apparatus as set forth in claim 19, further comprising first and second down-counters and first and second clocks, the first down-counter being responsive to clock pulses produced from the first clock to decrease the first hysteresis level to a given lower level at the first rate within the first length of time defined by a cycle of the clock pulses from the first clock, the second down-counter being responsive to clock pulses produced from the second clock to decrease the second hysteresis level to a given lower level at the second rate within the second length of time defined by a cycle of the clock pulses from the second clock.

21. A waveform-shaping apparatus as set forth in claim 20, wherein the given lower level to which the second hysteresis level is decreased is preset to zero in response to rising of the binary-coded signal.

22. A waveform-shaping apparatus as set forth in claim 14, wherein said correcting circuit modifies the first and second hysteresis levels of the first and second hysteresis components based on the given factor of the noise.

23. A waveform-shaping apparatus as set forth in claim 14, wherein said correcting circuit increases the first and second hysteresis levels of the first and second hysteresis components according to an increase in voltage of a battery incorporated in the vehicle.

24. A waveform-shaping apparatus as set forth in claim 14, wherein said correcting circuit modifies the first and second hysteresis levels of the first and second hysteresis components according to an ON/OFF state of a preselected electric load incorporated in the vehicle.

25. A waveform-shaping apparatus as set forth in claim 14, wherein the rotational speed sensor detects a speed of an engine, and wherein said correcting circuit modifies the first and second hysteresis levels of the first and second hysteresis components when the engine is undergoing a fuel cut.

26. A waveform-shaping apparatus as set forth in claim 14, wherein the second hysteresis level of the second hysteresis component is the sum of a variable level and a constant level, the variable level being decreased from a maximum level to a minimum level within the second length of time, the minimum level being equal to the constant level, the maximum level and the minimum level being determined according to the rotational speed.

27. A waveform-shaping apparatus as set forth in claim 26, wherein the constant level of the second hysteresis component is increased according to an increase in the rotational speed.

28. A waveform-shaping apparatus as set forth in claim 14, wherein the rotational speed sensor is a vehicle speed sensor.

29. A waveform-shaping apparatus as set forth in claim 1, wherein the rotational speed sensor is an engine speed sensor.

30. A waveform-shaping apparatus as set forth in claim 14, wherein said hysteresis providing circuit applies the first hysteresis component to the input analog signal for a first length of time and the second hysteresis component to the reference signal for a second length of time, and wherein said correcting means changes either or both of the first and second levels and the first and second lengths of time of the first and second hysteresis components according to a given vehicle condition.

31. A waveform-shaping apparatus as set forth in claim 30, wherein the rotational member is an engine of the vehicle, and wherein the given vehicle condition is based on whether the engine is in a cold starting operation or not.

32. A waveform-shaping apparatus as set forth in claim 31, wherein a determination of whether the engine is in the cold starting operation or not is made based on an engine coolant temperature and an engine starter signal.

33. A waveform-shaping apparatus as set forth in claim 30, wherein the rotational member is an engine of the vehicle, and wherein the given vehicle condition is based on whether the engine is undergoing a fuel cut or not.

34. A waveform shaping apparatus for a rotational speed sensor which detects a rotational speed of a rotatable member of a vehicle, said waveform shaping apparatus comprising:

waveform shaping means for waveform-shaping an input analog signal from the rotational speed sensor into a binary-coded signal, said binary-coded signal having a high level when the input analog signal is greater than a reference signal and a low level when the input analog signal is smaller than the reference signal;

hysteresis providing means for providing first and second hysteresis components having first and second hysteresis levels, respectively, said hysteresis providing means increasing a difference in level between the input analog signal and the reference signal so as to mask the influence of noise from interfering with an operation of said waveform shaping means, the first hysteresis component being applied to the input analog signal for a first period of time when the binary-coded signal has the high level, the second hysteresis component being applied to the reference signal for a second period of time when the binary-coded signal has the low level;

setting means for setting at least either the first and second hysteresis levels of the first and second hysteresis components or the first and second periods of time during which the first and second hysteresis components are applied based on the rotational speed detected by the rotational speed sensor; and changing means for changing said at least either the first and second hysteresis levels of the first and second hysteresis components or the first and second periods of time during which the first and second hysteresis components are applied according to a given vehicle condition.

35. A waveform-shaping apparatus as set forth in claim 34, wherein the rotational speed sensor is at least one of a vehicle speed sensor or an engine speed sensor.

36. A waveform-shaping apparatus as set forth in claim 34, wherein the rotational member is an engine of the vehicle, and wherein the given vehicle condition is based on whether the engine is in a cold starting operation or not.

37. A waveform-shaping apparatus as set forth in claim 36, wherein a determination of whether the engine is in the cold starting operation or not is made based on an engine coolant temperature and an engine starter signal.

38. A waveform-shaping apparatus as set forth in claim 34, wherein the rotational member is an engine of the vehicle, and wherein the given vehicle condition is based on whether the engine is undergoing a fuel cut or not.

39. A waveform-shaping apparatus as set forth in claim 34, wherein said changing means increases the first and second hysteresis levels of the first and second hysteresis components according to an increase of a battery voltage of the vehicle.

40. A waveform-shaping apparatus as set forth in claim 34, wherein said changing means changes the first and second hysteresis levels of the first and second hysteresis components according to an ON/OFF state of a preselected electric load of the vehicle.

* * * * *